United States Patent
Hino et al.

(10) Patent No.: US 11,623,307 B2
(45) Date of Patent: Apr. 11, 2023

(54) RESIN FLUX SOLDER PASTE AND MOUNT STRUCTURE

(71) Applicant: Panasonic Intellectual Property Management Co., Ltd., Osaka (JP)

(72) Inventors: Hirohisa Hino, Osaka (JP); Koso Matsuno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 133 days.

(21) Appl. No.: 17/235,080

(22) Filed: Apr. 20, 2021

(65) Prior Publication Data
US 2021/0354251 A1  Nov. 18, 2021

(30) Foreign Application Priority Data
May 12, 2020  (JP) ............... JP2020-083984

(51) Int. Cl.
| B23K 35/36 | (2006.01) |
| B23K 35/362 | (2006.01) |
| B23K 35/02 | (2006.01) |
| B23K 35/26 | (2006.01) |
| H05K 3/34 | (2006.01) |
| H05K 1/09 | (2006.01) |
| B23K 101/42 | (2006.01) |

(52) U.S. Cl.
CPC ........ *B23K 35/3613* (2013.01); *B23K 35/025* (2013.01); *B23K 35/262* (2013.01); *B23K 35/362* (2013.01); *H05K 1/092* (2013.01); *H05K 3/3457* (2013.01); *H05K 3/3489* (2013.01); *B23K 2101/42* (2018.08); *H05K 2201/032* (2013.01)

(58) Field of Classification Search
CPC .................... B23K 35/3613; B23K 35/362
USPC .................................................. 148/23
See application file for complete search history.

(56) References Cited

U.S. PATENT DOCUMENTS
| 2005/0056687 A1 | 3/2005 | Matsumoto et al. |
| 2011/0095423 A1 | 4/2011 | Ohashi et al. |
(Continued)

FOREIGN PATENT DOCUMENTS
| CN | 110352219 A | * 10/2019 | ............. C08G 59/66 |
| JP | 2005-059028 | 3/2005 | |
(Continued)

*Primary Examiner* — Weiping Zhu
(74) *Attorney, Agent, or Firm* — Wenderoth, Lind & Ponack, L.L.P.

(57) ABSTRACT

A resin flux solder paste includes a solder powder, and a flux, in which the flux contains at least an epoxy resin, a curing agent, a curing accelerator, and an activator, the epoxy resin contains 10% to 90% by weight of one or more of a biphenyl aralkyl type epoxy resin, a naphthalene type epoxy resin, and a dicyclopentadiene type epoxy resin, having an epoxy equivalent of 200 to 400, with respect to a total amount of the epoxy resin, and the curing agent contains 30% to 95% by weight of a biphenyl aralkyl phenol resin having a hydroxyl group equivalent of 150 to 350 with respect to a total amount of the curing agent, and 5% to 70% by weight of a phenol novolac resin having an allyl group having a hydroxyl group equivalent of 100 to 200 with respect to the total amount of the curing agent.

9 Claims, 5 Drawing Sheets

(56) References Cited

U.S. PATENT DOCUMENTS

2012/0329250 A1* 12/2012 Oda ................ H01L 24/29
                                                     257/E21.599
2014/0083567 A1   3/2014 Hamagawa et al.
2019/0232438 A1   8/2019 Hino et al.

FOREIGN PATENT DOCUMENTS

| JP | 5204241 B    | 6/2013  |
|----|--------------|---------|
| JP | 2013-220466  | 10/2013 |
| JP | 2017-188667  | 10/2017 |
| JP | 2019-130568  | 8/2019  |
| WO | 2012/160722  | 11/2012 |

* cited by examiner

| Product no. | | Example 1 | Example 2 | Example 3 | Example 5 | Example 6 | Example 7 | Example 8 | Example 9 | Comparative example 1 | Comparative example 2 |
|---|---|---|---|---|---|---|---|---|---|---|---|
| Solder powder | Kind | SAC305 | SAC305 | SAC305 | SAC305 | SAC305 | SAC305 | SAC305 | SAC105 | SAC305 | SAC305 |
| | Weight | 213 | 234 | 220 | 210 | 243 | 224 | 225 | 222 | 189 | 219 |
| Base epoxy resin | Kind | YD8125 | YD8125 | YD8125 | YD8125 | YD8125 | YD8125 | YD8125 | YD8125 | YD8125 | YD8125 |
| | Amount | 12.00 | 18.00 | 12.00 | 3.00 | 27.00 | 9.00 | 27.00 | 18.00 | 12.00 | 30.00 |
| High rigidity epoxy resin | Kind | NC3000 | HP6000 | HP7200 | HP6000 | NC3000 | NC3000 | HP6000 | HP7200 | NC3000 | NC3000 |
| | Amount | 18.00 | 12.00 | 18.00 | 27.00 | 3.00 | 21.00 | 3.00 | 12.00 | 18.00 | 0.00 |
| Adipic acid | Amount | 5.96 | 6.55 | 6.16 | 5.88 | 6.80 | 6.27 | 6.30 | 6.22 | 5.29 | 6.13 |
| liquid phenol resin | Amount | 7.99 | 6.20 | 7.02 | 10.90 | 4.55 | 0.93 | 13.20 | 9.10 | 3.22 | 17.30 |
| High rigidity phenol resin | Amount | 7.99 | 14.50 | 10.55 | 4.70 | 18.15 | 17.60 | 5.65 | 9.10 | 7.50 | 0.00 |
| Curing accelerator | Kind | TPP-K | TPP-MK | TPP | TPP-S | TPP-K | TPP-K | TPP-K | TPP-MK | TPP-K | TPP-K |
| | Amount | 0.090 | 0.095 | 0.070 | 0.080 | 0.105 | 0.095 | 0.080 | 0.095 | 0.240 | 0.095 |
| Solvent | Amount | 8.22 | 12.20 | 11.45 | 16.77 | 15.93 | 5.71 | 21.17 | 8.58 | 8.06 | 8.46 |
| Thixotropic agent | Amount | 1.06 | 1.17 | 1.10 | 1.05 | 1.22 | 1.12 | 1.13 | 1.12 | 0.96 | 1.09 |
| Elastic modulus increase start temperature | Temperature (°C) | 228 | 230 | 225 | 227 | 233 | 222 | 237 | 229 | 198 | 240< |
| | Determination | A | A | A | A | A | A | A | A | C | A |
| Glass transition temperature (°C) | | 128 | 118 | 125 | 123 | 110 | 134 | 89 | 113 | 131 | 71 |
| Heat cycle test | Number of defective elements | 0/5 | 0/5 | 0/5 | 0/5 | 0/5 | 0/5 | 2/5 | 0/5 | Unconnectable | 5/5 |
| | Determination | A | A | A | A | A | A | B | A | | C |

RESIN FLUX SOLDER PASTE AND MOUNT STRUCTURE

BACKGROUND

1. Technical Field

The present disclosure relates to a solder paste containing an epoxy resin as a flux component among solder pastes mainly used for soldering semiconductor components or electronic components to a circuit board and a mount structure.

2. Description of the Related Art

In recent years, mobile devices such as mobile phones and personal digital assistants (PDA) have been smaller and more functional. A variety of mount structures such as ball grid array (BGA), and chip scale package (CSP) are available as a mount technology for accommodating such advancements. Mobile devices are prone to mechanical load such as dropping impact. A quad flat package (QFP) absorbs such impact with its lead portions. However, BGA, CSP and the like do not have leads that relieve impact, and it is important to secure impact resistance reliability in these structures. In particular, with the recent increase in functionality and power of semiconductor devices, heat cycle resistance and heat resistance have become important. Therefore, high solder connection reliability in device mounting has been required, and a structural method and a solder material capable of realizing high solder connection reliability have been desired.

Therefore, as a further countermeasure, a semiconductor mount structure using a solder paste containing a thermosetting resin in the flux and a method for producing the same have been proposed (for example, refer to Japanese Patent No. 5204241).

By heating solder paste containing a thermosetting resin in a flux, the resin contained in the flux and the solder are separated from each other in a step of melting and connecting the solder, and thus a reinforced structure in which the resin covers the periphery of the solder can be formed. As a result of the reinforcement, it is possible to increase the strength of the solder connection portion.

However, such solder pastes that have been put into practical use are those using low-melting-point solders such as Sn-Bi-based solders as shown in Japanese Patent No. 5204241. For example, a solder paste containing a thermosetting resin using a high-melting-point solder such as SAC solder has not been put into practical use yet.

SUMMARY

According to a first aspect of the present disclosure, there is provided a resin flux solder paste including; a solder powder; and a flux,
in which the flux contains at least an epoxy resin, a curing agent, a curing accelerator, and an activator,
the epoxy resin contains 10% to 90% by weight of one or more of a biphenyl aralkyl type epoxy resin, a naphthalene type epoxy resin, and a dicyclopentadiene type epoxy resin, having an epoxy equivalent of 200 to 400, with respect to a total amount of the epoxy resin, and
the curing agent contains 30% to 95% by weight of a biphenyl aralkyl phenol resin having a hydroxyl group equivalent of 150 to 350 with respect to a total amount of the curing agent, and 5% to 70% by weight of a phenol novolac resin having an allyl group having a hydroxyl group equivalent of 100 to 200 with respect to the total amount of the curing agent.

According to a second aspect of the present disclosure, there is provided a mount structure in which an electronic component is mounted on a circuit board by using the resin flux solder paste,
the mount structure including: a conductive portion in which the electronic component and the circuit board are metallically joined; and
a reinforcing portion formed by covering a periphery of the conductive portion with a cured product of the flux.

DETAILED DESCRIPTIONS

Figure 3:
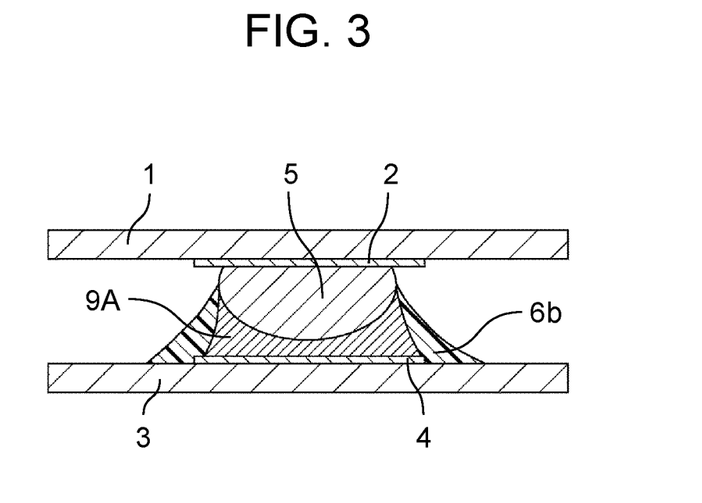
FIG. 3 is a cross-sectional view of a solder joint portion of a CSP joined using a solder paste in the related art.

FIG. 3 is a cross-sectional view of a connection portion joined using a solder paste in the related art. As shown in FIG. 3, electrode 2 provided on circuit board 1 and electrode 4 provided on circuit board 3 are joined by solder bump 5 and solder conductive portion 9A, and the periphery thereof is formed as a structure that is reinforced by reinforcing portion 6b which is a solid resin after curing.

In a mounting step using the solder paste, the wiring electrodes of the circuit board and the like are printed at predetermined positions using a metal mask and then heated in a reflow furnace. At that time, the flux has the effect to chemically remove the oxide film on the surface of the metal to be soldered and the oxide film on the surface of the solder powder by a reduction reaction, that is, fluxing effect, to enable melting and connection of the solder. Thereafter, the thermosetting resin such as epoxy resin is successively cured, and the wiring electrodes of the circuit board and the electronic components are joined and reinforced with the resin in one heating reflow step.

On the other hand, as a solder material used for an ordinary cream solder paste (without a thermosetting resin), a Pb eutectic solder has been typically used in the related art, but nowadays, a lead-free solder is used in consideration of the environment. Examples of the lead-free solder include Sn-Bi-based solders, Sn-Ag-Cu-based solders (hereinafter, also simply referred to as SAC solders), and Sn-Cu-based solders. In mounting using the SAC solder or the like, an In-containing solder having a different metal composition has also been put into practical use as a countermeasure for realizing high connection reliability. As typical examples of SAC solders, SAC305 (Sn-3.0Ag-0.5Cu) solder (hereinafter, also simply referred to as SAC305 solder) and SAC105 (Sn-1.0Ag-0.5Cu) solder having a lower silver proportion (silver proportion: 1%) (hereinafter, also simply referred to as SAC105 solder) have been studied and gradually put into practical use.

As described above, by using a solder paste containing a thermosetting resin, the connection reliability can be improved by a reinforced structure formed of the resin without causing the problems of process delay and cost. However, such solder pastes that have been put into practical use are those using low-melting-point solders such as Sn-Bi-based solders as shown in Japanese Patent No. 5204241. For example, a solder paste containing a thermosetting resin using a high-melting-point solder such as SAC solder has not been put into practical use yet.

As a result of intensive studies, the present inventors have found that the reasons that the solder paste has not been put into practical use is as follows. For example, in order to sufficiently melt the SAC305 solder having a melting point of about 219° C. in a reflow profile, it is required to raise the peak temperature of the reflow furnace for mounting to 240° C. to 260° C. Generally, the curing reaction of an epoxy resin, which is a thermosetting resin in the flux of the solder paste, is usually started at 100° C. to 150° C. Therefore, in the reflow profile, the epoxy resin starts to be cured in advance and is thickened before the solder particles dispersed in the solder paste are melted and aggregated at the melting point, which makes it difficult to form a suitable solder joint portion or the like. Further, the epoxy resin has a very high curing rate at a high temperature of around 200° C. as compared with a temperature of around 150° C., and is solidified in a short period of time. Therefore, particularly in a case of a solder having a high melting point, there is a problem that it is very difficult to form a solder joint portion and a resin reinforcing portion with a solder paste.

Here, the present inventors have found that as a result of intensive studies of a curing system in which the curing of the epoxy resin does not progress substantially until the melting temperature of SAC305 solder reaches about 220° C. and the reaction starts in a temperature range higher than a melting point of about 220° C. of SAC305 solder, the phenol novolac resin matches the reaction behavior.

A mixture in which a phenol novolac resin is dissolved in an epoxy resin (hereinafter, referred to as a phenol novolac+ epoxy mixture) has low reactivity at room temperature and is excellent in storage stability. Further, since the reaction starts rapidly in a temperature range of 220° C., which is the melting point of SAC305 solder, or higher, inhibition of solder melting is extremely less likely to occur and there is an advantage that solder connectivity is excellent. However, as a defect, it has been found that the glass transition temperature (hereinafter, also referred to as Tg) of a cured product of a commonly used liquid bisphenol type epoxy resin and a low molecular weight phenol novolac resin is as low as near 60° C. to 80° C. For epoxy resin curing agents, amine compounds, imidazoles, and acid anhydrides are well known as curing agents other than phenol novolac resins, and many of these cured products have a Tg of 100° C. or higher.

As described in the background above, the fields of development of the present disclosure include mounting of a power semiconductor that generate a lot of heat. That is, since heat cycle resistance and heat resistance in a high temperature environment are important, heat resistance is also required for a solder portion that connects a semiconductor and a circuit board. Specifically, the conditions for reliability are severe and include a high temperature humidification condition in which the temperature is 85° C. and a humidity is 85%, a heat cycle test between −40° C. and +105° C., and a heat cycle test between −45° C. and +125° C., a high temperature exposure test at 125° C., and the like. Therefore, even in the resin flux solder paste, there is a problem that the Tg of the cured resin product needs to be 80° C. or higher in order to clear the above reliability. Therefore, an object of the present disclosure is to provide a solder paste that can be applied to a solder that requires a high melting point (for example, SAC (tin silver copper)-based solder) and has a Tg of a cured resin product of 80° C. or higher, and a mount structure in which an electronic component is mounted using the same.

Hereinafter, exemplary embodiments of the present disclosure will be described in detail. The present disclosure is not limited to the exemplary embodiments. The present disclosure can be appropriately modified and carried out within the scope of the object of the present disclosure. Hereinafter, the resin flux solder paste and the mount structure will be described.

Hereinafter, exemplary embodiments of the present disclosure will be described with reference to the drawings.

Resin Flux Solder Paste

A resin flux solder paste according to an exemplary embodiment of the present disclosure is a resin flux solder paste including a solder powder, and a flux, the flux contains at least an epoxy resin, a curing agent, a curing accelerator, and an activator, the epoxy resin contains 10% to 90% by weight of one or more of a biphenyl aralkyl type epoxy resin, a naphthalene type epoxy resin, and a dicyclopentadiene type epoxy resin, having an epoxy equivalent of 200 to 400, with respect to a total amount of the epoxy resin, and the curing agent contains 30% to 95% by weight of a biphenyl aralkyl phenol resin having a hydroxyl group equivalent of 150 to 350 with respect to a total amount of the curing agent, and 5% to 70% by weight of a phenol novolac resin having an allyl group having a hydroxyl group equivalent of 100 to 200 with respect to the total amount of the curing agent.

According to the solder paste of the present disclosure, since the solder paste can be applied to solder connection at a high melting point and the Tg of the cured resin product of the solder paste is 80° C. or higher, high heat resistance is obtained.

Solder Powder

The solder powder contained in the solder paste according to the exemplary embodiment is not particularly limited and it is preferable to use a solder powder having a melting point of 180° C. or higher and particularly 200° C. or higher. The composition of the solder powder is not particularly limited and may be in the form of simple Sn or a solder alloy. As the solder alloy, for example, an alloy of Sn-Ag-Cu-based solder (SAC solder), Sn-Cu-based solder or Sn-Ag-based solder, which is based on Sn, and alloys further containing an additional metal (more specifically, a trace metal described later) in these alloys can be used. Examples of the SAC solder include SAC305 (Sn-3.0Ag-0.5Cu) solder having a melting point of 220° C., and SAC105 (Sn-1.0Ag-0.5Cu) solder having a melting point of 225° C. Examples of the Sn-Ag-based solder include Sn-3.5Ag solder having a melting point of 221° C., and examples of the Sn-Cu-based solder include Sn-0.7Cu solder having a melting point of 227° C. Among these solder alloys, SAC305 solder is preferable. This is because SAC305 solder is currently widely used in consumer electronic devices, achieves high connection reliability and low cost, and is also widely used for solder balls for CSP and BGA packages.

The content of the solder powder is preferably 5% by weight or more and less than 60% by weight or 60% by weight or more and 95% by weight or less with respect to the total amount of the resin flux solder paste according to the exemplary embodiment. When the content of the solder powder is 60% by weight or more and 95% by weight or less, the metal proportion of the solder paste becomes high and a sufficient metal connection can be made with the metal component of the solder paste itself. Therefore, for example, the solder paste can be used in both a case of using SAC solder balls (for example, BGA type) and a case of not using SAC solder balls (for example, LGA type).

When the content of the solder powder is 5% by weight or more and less than 60% by weight, the solder paste is suitable for use a flux for connecting the SAC solder ball and the electrode of the circuit board. In that case, for example, the metal joint is mainly formed of SAC solder balls, and the metal of the solder paste also assists the metal connection of the solder balls Further, since the resin proportion in the solder paste is high, the periphery of the solder connection portion can be effectively reinforced with the resin and high connection strength can be exhibited.

In describing the composition of the solder powder, the symbols of the elements contained in the solder powder are linked by hyphens. In the metal composition of the solder powder described herein, the metallic elements are often preceded by numerical values or numerical ranges. These numerical values or numerical ranges represent % by weight (=% by mass) of each element of the metal composition, as commonly used in the art. The solder powder may contain trace amounts of metals inevitably mixed, for example, Ni, Ge, Zn, Sb, and Cu, provided that the solder powder is configured substantially from the elements shown.

The melting point of the solder powder (or solder) in the present specification refers to the temperature after the solder powder has melted in an observation of state changes of a sample under the applied heat of increasing temperatures, and can be measured using, for example, DSC or TG-DTA.

Flux

The flux contains at least an epoxy resin, a curing agent, a curing accelerator, and an activator. When the resin flux solder paste according to the exemplary embodiment contains the flux, it is possible to form a joint portion having high connection reliability and heat resistance. When the Tg of the cured resin product of the solder paste is 80° C. or higher, higher heat resistance can be realized.

It is preferable that when the flux is heated at a constant rate of 20° C./min, a behavior in which the elastic modulus increases at 220° C. or higher is exhibited. In a case where the elastic modulus increases at 220° C. or higher, when the resin flux solder paste is heated, the solder powder at a temperature of lower than 220° C. is sufficiently melted, and then the flux is easily formed into a cured product by a curing reaction at 220° C. or higher. Therefore, the solder powder is melted to form a conductive portion, for example, conduction between an electronic component and a circuit board is easily secured, and the surface of the conductive portion is easily covered with the cured product of the flux, so that the mount structure to be obtained has excellent conductivity and mechanical strength. The method of measuring the elastic modulus (storage elastic modulus (G)) will be described in detail in Examples.

Epoxy Resin

When the flux contains an epoxy resin, other components such as a solder powder are easily dispersed in the epoxy resin.

The epoxy resin contains 10% to 90% by weight of one or more of a biphenyl aralkyl type epoxy resin, a naphthalene type epoxy resin, and a dicyclopentadiene type epoxy resin, having an epoxy equivalent of 200 to 400, with respect to the total amount of the epoxy resin.

In the exemplary embodiment, a mixing design to increase the Tg of the cured product of the epoxy resin is performed. To increase the Tg, it is preferable that the epoxy resin has a large molecular weight and a rigid skeleton. However, many epoxy resins having a large molecular weight are usually solid at ordinary temperature, and even when the resin is mixed with liquid epoxy, the viscosity is high. As a result of intensive studies, the present inventors have found that a biphenyl aralkyl type epoxy resin, a naphthalene type epoxy resin, and a dicyclopentadiene type epoxy resin are desirable as an epoxy resin having a rigid skeleton and a relatively low molecular weight. These can be mixed with a liquid epoxy resin to have a relatively low viscosity.

As a result of further studies by the present inventors, it has been found that when the above epoxy having a rigid skeleton is used in order to increase the Tg of the cured epoxy resin product, the reactivity with the curing agent is often increased. Normally, when the resin flux solder paste is heated, the resin reacts and thickens before the temperature of the resin flux solder paste reaches the melting point of the solder powder (for example, the melting point of the SAC solder is 220° C.). As a result, it has been found that thickening may hinder the metal joint of the solder, resulting in poor joint (refer to FIG. 4).

Figure 5:
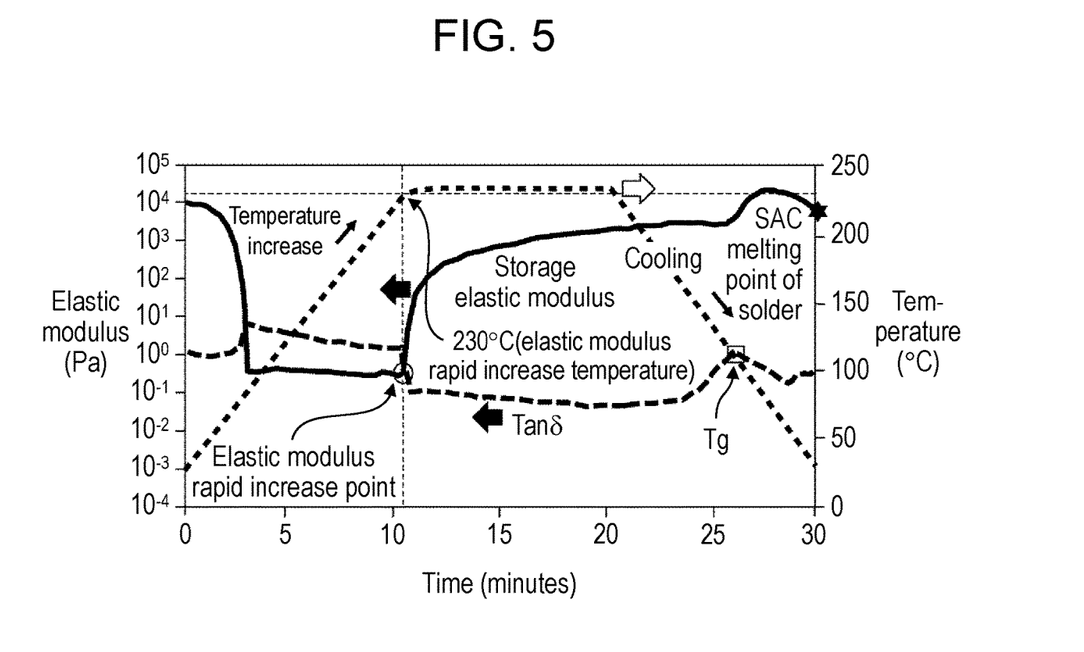
FIG. 5 shows the behavior of the elastic modulus when a flux of a resin flux solder paste of Example 2 is heated and cooled at a constant rate with a rheometer "DHR-2" viscoelasticity measuring device manufactured by TA Instruments Co., Ltd.

Based on this finding, the present inventors have come up with the idea that the temperature at which the resin reacts and thickens is set to be higher than the melting point of the solder powder by adjusting the epoxy equivalent of the epoxy resin having a rigid skeleton to 200 to 400 (refer to FIG. 5).

As a specific commercially available product of the epoxy resin having a rigid skeleton (high rigidity epoxy resin) having an epoxy equivalent of 200 to 400, a biphenyl aralkyl type epoxy resin (product number NC 3000, manufactured by Nippon Kayaku Co., Ltd., epoxy equivalent: 276), a naphthalene type epoxy resin (product number HP 6000, manufactured by DIC Corporation, epoxy equivalent: 215), a dicyclopentadiene type epoxy resin (product number HP 7200, manufactured by DIC Corporation, epoxy equivalent: 247), and the like can be exemplified. These resins may be used alone or may be used in combination of two or more thereof.

When the epoxy resin contains 10% to 90% by weight of the epoxy resin having an epoxy equivalent of 200 to 400, the solder powder can be satisfactorily dispersed in the epoxy resin. The resin flux solder paste of the exemplary embodiment may further contain a solvent from the viewpoint of further improving dispersibility.

The epoxy resin may contain an epoxy resin other than the above biphenyl aralkyl type epoxy resin. The epoxy resin is preferably liquid at ordinary temperature, but may be liquefied by mixing an epoxy resin being solid at ordinary temperature with a liquid epoxy resin or by adding a solvent.

As other liquid epoxy resins at ordinary temperature, various epoxy resins can be used as long as two or more epoxy groups are included in one molecule, and the molecular weight and molecular structure thereof are not particularly limited. For example, various liquid epoxy resins of glycidyl ether type, glycidyl amine type, glycidyl ester type and olefin oxidation type (alicyclic type) can be used. Specific examples of commercially available products include a bisphenol A type epoxy resin (product number: jER828, manufactured by Mitsubishi Chemical Corporation) and YD 8125 (manufactured by NIPPON STEEL Chemical & Material Co., Ltd., epoxy equivalent: 170).

Curing Agent

The curing agent cures the epoxy resin. The curing agent contains 30% to 95% by weight of a biphenyl aralkyl phenol resin having a hydroxyl group equivalent of 150 to 350 with respect to the total amount of the curing agent and 5% to 70% by weight of a phenol novolac resin having an allyl group having a hydroxyl group equivalent of 100 to 200 with respect to the total amount of the curing agent. With such a composition, it is possible to prevent the epoxy resin from being cured until the solder powder is melted.

The biphenyl aralkyl phenol resin and the phenol novolac resin having an allyl group preferably have two or more phenolic hydroxyl groups capable of reacting with the epoxy group of the epoxy resin in one molecule. Two or more kinds of phenol resins are used for the flux of the solder paste of the exemplary embodiment, but the phenol novolac resin having an allyl group has both a phenolic hydroxyl group and an allyl group in at least one molecule.

It is presumed that since the alignment of the phenolic hydroxyl groups by hydrogen bonds is hindered due to the steric hindrance effect of the allyl group of the phenol novolac resin having an allyl group, the viscosity of the phenol novolac resin which is originally a solid is lowered due to the effect. Particularly, among these phenol resins, those having a low molecular weight dimer (the following formula, n=0) can adopt a liquid form. Specific examples of commercially available products include MEH-800011 (viscosity: 1500 to 3500 mPa·s, hydroxyl group equivalent: 139 to 143) and MEH-8005 (viscosity: 4500 to 7500 mPa·s, hydroxyl group equivalent: 133 to 138) manufactured by Meiwa Plastic Industries, Ltd. In the present disclosure, the hydroxyl group equivalent refers to a numerical value measured by a neutralization titration method according to Japanese Industrial Standards (JIS) K 0070.

n = 0~3

The cured product of the phenol novolac resin having an allyl group with the epoxy resin has a Tg of 80° C. or higher and has a high Tg. When the phenol novolac resin having an allyl group of the exemplary embodiment is contained, the crosslink density of the cured product can be increased, and as a result, a high Tg can be obtained.

Among various phenol novolac resins, a biphenyl aralkyl phenol resin is the most excellent resin in terms of both increasing Tg and suppressing an increase in viscosity. Specific products include biphenyl aralkyl type phenol novolac resin, MEHC 7851S (manufactured by Meiwa Kasei Co., Ltd., hydroxyl group equivalent: 210).

Curing Accelerator

The curing accelerator accelerates a reaction between the epoxy resin classified as having relatively low reactivity and the curing agent (for example, phenol novolac resin), and causes the reaction at a temperature equal to or higher than the melting point of the solder powder in a short period of time without substantially causing the reaction at a temperature lower than the melting point (for example, 220° C.) of the solder powder. Examples of the curing accelerator include phosphorus-based compounds (more specifically, organic phosphine compounds and salts thereof, quaternary phosphonium compounds and salts thereof, and the like) and nitrogen-based compounds (more specifically, imidazoles, DBU-based salts, tertiary amine compounds, and the like). Among these, for example, when the melting point of the solder powder is 220° C., as the curing accelerator that does not substantially react at a temperature lower than 220° C. and accelerates the reaction at a temperature of 220° C. or higher in a short period of time, for example, one or more of triphenylphosphine, which is a phosphorus-based quaternary phosphonium compound, triphenylphosphine triphenylborane, tetraphenylphosphonium tetraphenylborate, and tetraphenylphosphonium-p-tolylborate, which are salts thereof, are preferable, and tetraphenylphosphonium-p-tolylborate is particularly preferable since the compound has a high melting point of 305° C.

Activator

The activator removes a metal oxide film that may be present on the surface of a member to be joined (more specifically, an electrode of an electronic component, wiring, and/or the solder powder), for example, in a temperature range in which the resin flux solder paste is heated.

The kind of activator is not limited and any suitable activator may be used as long as the activator has a function of removing a metal oxide film. Examples of the activator include an organic acid, a halogen, and an amine salt having the reducing power. In electrical and electronic applications, a halogen compound can cause poor insulation when the compound is included in the cured epoxy resin product. In addition, a general amine salt reacts with an epoxy resin and tends to impair storage stability. Therefore, among these activators, an organic acid having excellent insulation deterioration resistance is preferable.

Organic acids have a particularly excellent fluxing effect. Here, the fluxing effect means the reducing effect that removes the oxide coating that has occurred on the metal surface to which the solder paste is applied, and the effect that lowers the surface tension of a molten solder to accelerate wettability for the soldered metal surface. Furthermore, in terms of reactivity with the epoxy resin, organic acids can react with the epoxy resin when heated, though the reactivity is not as high as that of amine salts at room temperature. However, exceptionally, among amine-base activators, triethanolamine (TEA) is preferable since the reactivity is mild and storage stability is excellent.

Since the organic acid is incorporated into the cured product of the epoxy resin after the solder is reduced to remove the oxide film, almost no adverse effects such as corrosiveness occur.

The kind of the organic acid is not particularly limited, and acids of any organic compounds can be used. Examples of the organic acid include rosin component materials typified by abietic acid, sebacic acid, adipic acid, glutaric acid, succinic acid, malonic acid, citric acid, and pimelic acid. In particular, considering the reaction with the epoxy resin, a dibasic acid that does not lower the crosslink density is preferable.

Since the carboxyl group of the organic acid reacts with the epoxy group even at a temperature of 200° C. or lower, the organic acid is involved in thickening the flux in the solder paste. Therefore, in a case where the organic acid is used as the activator, the melting point of the organic acid is preferably 130° C. or higher and 220° C. or lower, more preferably 130° C. or higher and 200° C. or lower, and even more preferably 133° C. or higher and 186° C. or lower. This is because the melting and aggregation of the solder described later is less likely to be inhibited by using a dibasic organic acid having a high melting point.

Specifically, for solder having a high melting point, such as SAC solder, the active force (that is, the reducing effect that removes the oxide film on the solder surface) is small in a low temperature range of 130° C. or lower, and thus it is desirable that the active force is exhibited in a high temperature range. Examples of the organic acid having a melting point of 130° C. or higher and 220° C. or lower include succinic acid (melting point: 186° C.), adipic acid (melting point: 152° C.), cork acid (melting point: 142° C.), and sebacic acid (melting point: 133° C.), which are a kind of dibasic acid. Although oxalic anhydride has a high melting point of 189° C., the oxalic anhydride has high hygroscopicity and becomes a dihydrate having a low melting point (melting point: 101° C.) due to moisture absorption. In addition, the organic acid having a melting point higher than the melting point of the SAC solder, such as isophthalic acid (melting point: 340° C.), cannot usually be expected to have a function of removing the oxide film of the solder. However, it is not intended to exclude these organic acids having a melting point of lower than 130° C. or higher than 220° C. from the organic acids available in the exemplary embodiment, and the organic acid may be appropriately used depending on the solder actually used, the reflow temperature, and the like. These organic acids may be used as a single component, or as a mixture of two or more components.

Other Components

Other components of the flux contained in the solder paste include, for example, commonly used modifiers (for example, rosin), additives, solvents, and thixotropy imparting agents. The solvent can reduce the viscosity of the solder paste and impart viscosity reduction and fluidity to the solder paste. Examples of the solvent include diethylene glycol monohexyl ether. The thixotropy imparting agent maintains the solvent print shape. Examples of the thixotropy imparting agent include hydrogenated castor oil, stearic acid amide, and a sorbitol compound. As a specific product of the thixotropy imparting agent, for example, GEL ALL D, manufactured by New Japan Chemical Co., Ltd., may be used.

Method of Producing Solder Paste

Next, examples of a method of preparing a solder paste according to the exemplary embodiment of the present disclosure described above, and a specific method of preparing (or manufacturing) a mount structure by mounting an electronic component on a circuit board by using the solder paste are shown.

First, the above-mentioned epoxy resin and curing agent (phenol resin) are heated and dissolved to prepare a uniform resin mixture. Next, the activator, the curing accelerator and, if necessary, the solvent are then weighed and mixed to prepare a flux. The solder powder is added to the flux and the materials are mixed and kneaded. In this manner, a resin flux solder paste is prepared.

The solvent may be added, if necessary, before the addition of the activator to reduce the viscosity of the flux. In addition, if necessary, the thixotropy imparting agent may be added to improve printability.

Mount Structure

The mount structure according to the exemplary embodiment of the present disclosure is a mount structure in which an electronic component is mounted on a circuit board using the above-mentioned resin flux solder paste, and includes a conductive portion in which the electronic component and the circuit board are metallically joined, and a reinforcing portion formed by covering a periphery of the conductive portion with a cured product of the flux.

Figure 1:
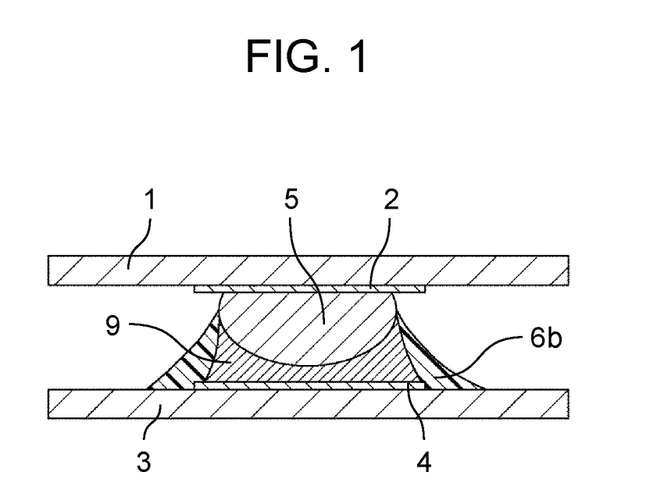
FIG. 1 is a cross-sectional view of a CSP solder joint portion joined using a resin flux solder paste according to an exemplary embodiment of the present disclosure.

The mount structure according to the exemplary embodiment will be described with reference to FIG. 1. FIG. 1 is a cross-sectional view of a CSP solder joint portion joined using the resin flux solder paste. As shown in FIG. 1, a mount structure (for example, a semiconductor device) includes circuit board 1 and circuit board 3, electrodes 2 and 4 provided on circuit boards 1 and 3, solder bump 5 and solder conductive portion 9 with which electrodes 2 and 4 are metallically joined, and reinforcing portion 6b that covers the surface of solder conductive portion 9. Circuit board 1 provided with electrode 2 is an electronic component (for example, a chip component and a semiconductor component). The chip component includes, for example, a chip resistor and a chip capacitor. Circuit board 3 provided with electrodes 4 is, for example, a printed circuit board. The semiconductor component may be a semiconductor package such as a CSP or BGA formed by providing a solder ball as a terminal, a QFP formed by providing a lead as a terminal, and a semiconductor element (bare chip) formed by providing a terminal without being housed in the package. Circuit boards 1 and 3 have conductive wiring. Electrode 2 is a terminal of the electronic component. Electrodes 2 and 4 are electrically connected via solder bump 5 and solder conductive portion 9. Reinforcing portion 6b is formed of a cured product of the flux, and covers the surface (periphery) of solder conductive portion 9 to reinforce solder conductive portion 9 and improve the mechanical strength.

Method of Manufacturing Mount Structure

The mount structure according to the exemplary embodiment can be manufactured by mounting a semiconductor component on, for example, a circuit board having conductor wiring by using the resin flux solder paste described above. A method of manufacturing the mount structure will be described with reference to FIGS. 2A to 2D. FIGS. 2A to 2D are cross-sectional explanatory views schematically showing a step of joining a ball portion of the CSP using the resin flux solder paste according to the exemplary embodiment of the present disclosure. The method of manufacturing the mount structure includes, for example, a coating step, a mounting step, and a joining step.

Figure 2A:
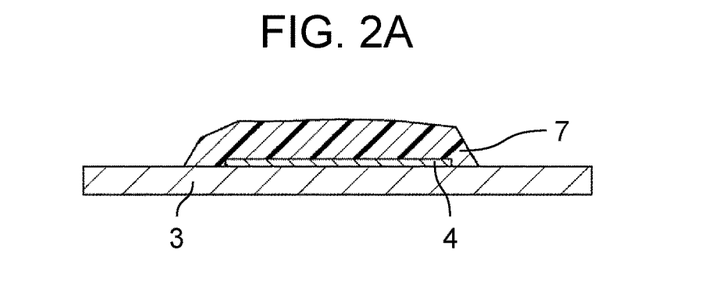
FIG. 2A is a cross-sectional explanatory view schematically showing a step of joining a ball portion of a CSP using the resin flux solder paste according to the exemplary embodiment of the present disclosure.

In the coating step, as shown in FIG. 2A, resin flux solder paste 7 is applied to electrode 4 of circuit board 3. For example, resin flux solder paste 7 can be applied by stacking a metal mask having through holes provided at the same positions as electrodes 4 on circuit board 3, then supplying resin flux solder paste 7 to the surface of the metal mask, and filling the through holes with the solder paste using a squeegee. Thereafter, when the metal mask is separated from circuit board 3, circuit board 3 in which resin flux solder paste 7 is applied to each electrode 4 can be obtained.

Figure 2B:
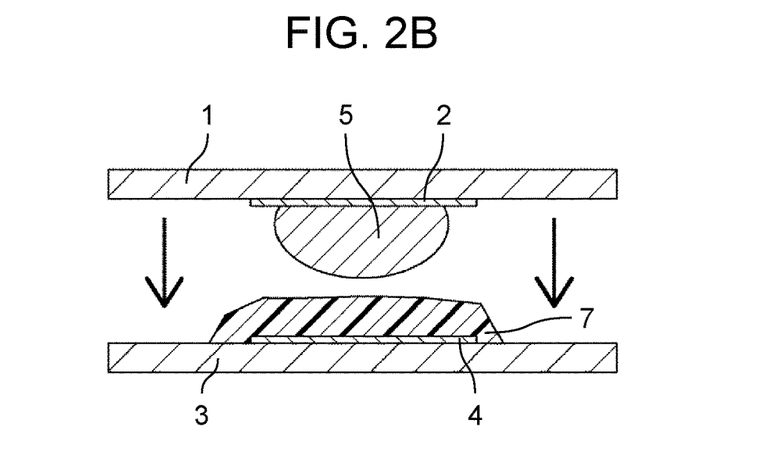
FIG. 2B is a cross-sectional explanatory view schematically showing the step of joining the ball portion of the CSP using the resin flux solder paste according to the exemplary embodiment of the present disclosure.

In the mounting step, as shown in FIG. 2B, the electronic component (circuit board 1) is mounted on circuit board 3 such that electrode 4 to which resin flux solder paste 7 is applied and electrode 2 of circuit board 1 face each other using a chip mounter or the like. Specifically, while applied resin flux solder paste 7 is in an uncured state, the chip component or the semiconductor component is stacked on the circuit board such that electrode 4 of coated circuit board 3 faces the terminal of the chip component or the semiconductor component thereon.

Figure 2C:
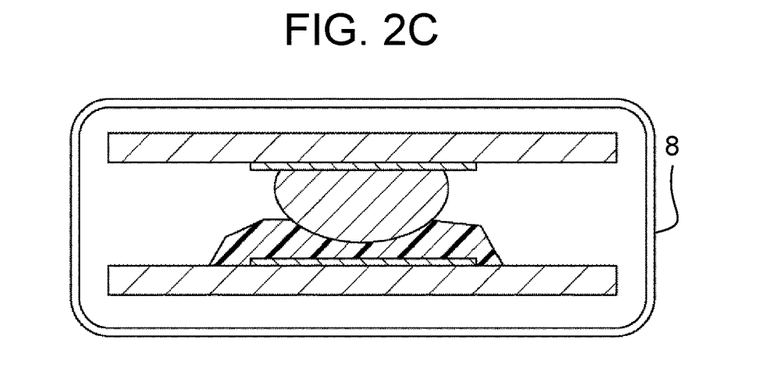
FIG. 2C is a cross-sectional explanatory view schematically showing the step of joining the ball portion of the CSP using the resin flux solder paste according to the exemplary embodiment of the present disclosure.
Figure 2D:
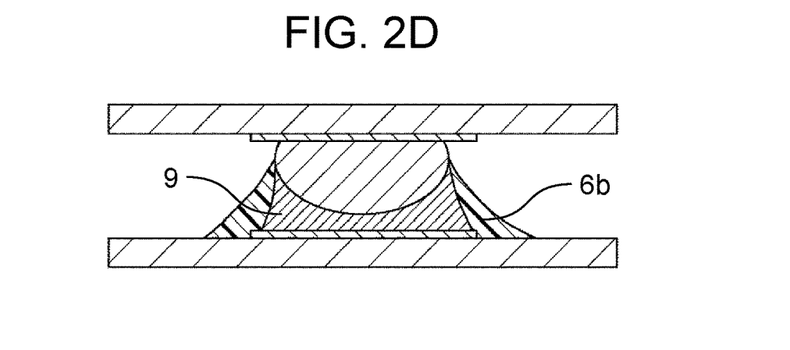
FIG. 2D is a cross-sectional explanatory view schematically showing the step of joining the ball portion of the CSP using the resin flux solder paste according to the exemplary embodiment of the present disclosure.

In the joining step (reflow step), as shown in FIG. 2C, circuit board 1 on which the electronic component is mounted is heated by using heater 8. For example, a printed wiring board on which the chip component is arranged is heated to a predetermined heating temperature with a reflow furnace. In this manner, as shown in FIG. 2D, a solder joint portion (conductive portion 9) in which the solder powder is melted to be integrated with the solder ball, and reinforcing portion 6b in which the surface of conductive portion 9 is formed of a cured flux product (cured epoxy resin product) are formed. The electronic component and circuit board 1 are electrically joined to each other through conductive portion 9.

In the joining step, it is required that the solder powder is sufficiently melted and then the curing reaction of the resin component of the flux sufficiently and appropriately proceeds. Specifically, in the joining step, when the curing reaction of the epoxy resin which is a flux component in the solder paste proceeds before the solder powder is sufficiently melted, the flux is thickened. Then, the aggregation and melting of the solder particles are inhibited, and proper metal conduction cannot be obtained. In order to avoid such a situation and obtain appropriate conduction and good mechanical strength, it is required that the curing reaction of the resin of the flux proceeds slowly (the progress of the curing reaction is suppressed) until the temperature of heater 8 (for example, reflow furnace) reaches the melting point of the solder powder used. In addition, it is required that the curing reaction of the resin of the flux proceeds to completion in a short period of time (for example, in about several minutes) after the temperature of heater 8 reaches the melting point of the solder powder and the solder powder is sufficiently melted and melted and joined to the electrode metal of the circuit component by being fused with the solder ball of the electronic component (for example, semiconductor component).

EXAMPLES

Hereinafter, the present disclosure will be described in more detail with reference to Examples. The present disclosure is not limited to the following examples. In addition, unless otherwise specified, parts and % in Examples are based on weight.

Preparation of Solder Paste

First, the components (a solder powder, a flux raw material, and the like) constituting the solder paste shown below were prepared.

Solder Powder

SAC305: Sn-3.0Ag-0.5Cu having an average particle size of 10 to 25 μm and a melting point of 219° C. (manufactured by Mitsui Mining & Smelting Co., Ltd.)

SAC105: Sn-1.0Ag-0.5Cu having an average particle size of 10 to 25 pm and a melting point of 225° C. (manufactured by Mitsui Mining & Smelting Co., Ltd.)

Flux

Epoxy Resin: Base Epoxy Resin

Bisphenol A type epoxy resin, YD8125 (manufactured by Nippon Steel Chemical & Materials Co., Ltd., epoxy equivalent: 170)

Epoxy Resin: High Rigidity Epoxy Resin

Biphenyl aralkyl type epoxy resin, NC3000 (manufactured by Nippon Kayaku Co., Ltd., epoxy equivalent: 276)

Naphthalene type epoxy resin (HP 6000, manufactured by DIC Corporation, epoxy equivalent: 215)

Dicyclopentadiene type epoxy resin (HP 7200, manufactured by DIC Corporation, epoxy equivalent: 247)

Curing Agent: Phenol Novolac Resin Having Allyl Group (Liquid Phenol Resin)

Allylated phenol novolac resin (allyl-modified phenol novolac resin): MEH 8000H (manufactured by Meiwa Plastic Industries, Ltd., hydroxyl group equivalent: 140)

Curing Agent: Biphenyl Aralkyl Phenol Resin (High Rigidity Phenol Resin)

Biphenyl aralkyl type phenol novolac resin, MEHC 7851S (manufactured by Meiwa Plastic Industries, Ltd., hydroxyl group equivalent: 210, used in Examples 1 to 9)

General phenol novolac resin: H-4 (manufactured by Meiwa Plastic Industries, Ltd., hydroxyl group equivalent: 104, used in Comparative Example 1)

Curing Accelerator

Triphenylphosphine (TPP)

Triphenylphosphine triphenylborane (TPP-S)

Tetraphenylphosphonium tetraphenylborate (TPP-K)

Tetraphenylphosphonium-p-tolylborate (TPP-MK)

Activator: Organic Acid

Adipic acid (manufactured by Tokyo Chemical Industry Co., Ltd.)

Others

Solvent

Diethylene glycol monohexyl ether

Thixotropic Agent

GEL ALL D (manufactured by New Japan Chemical Co., Ltd.)

Figure 6:
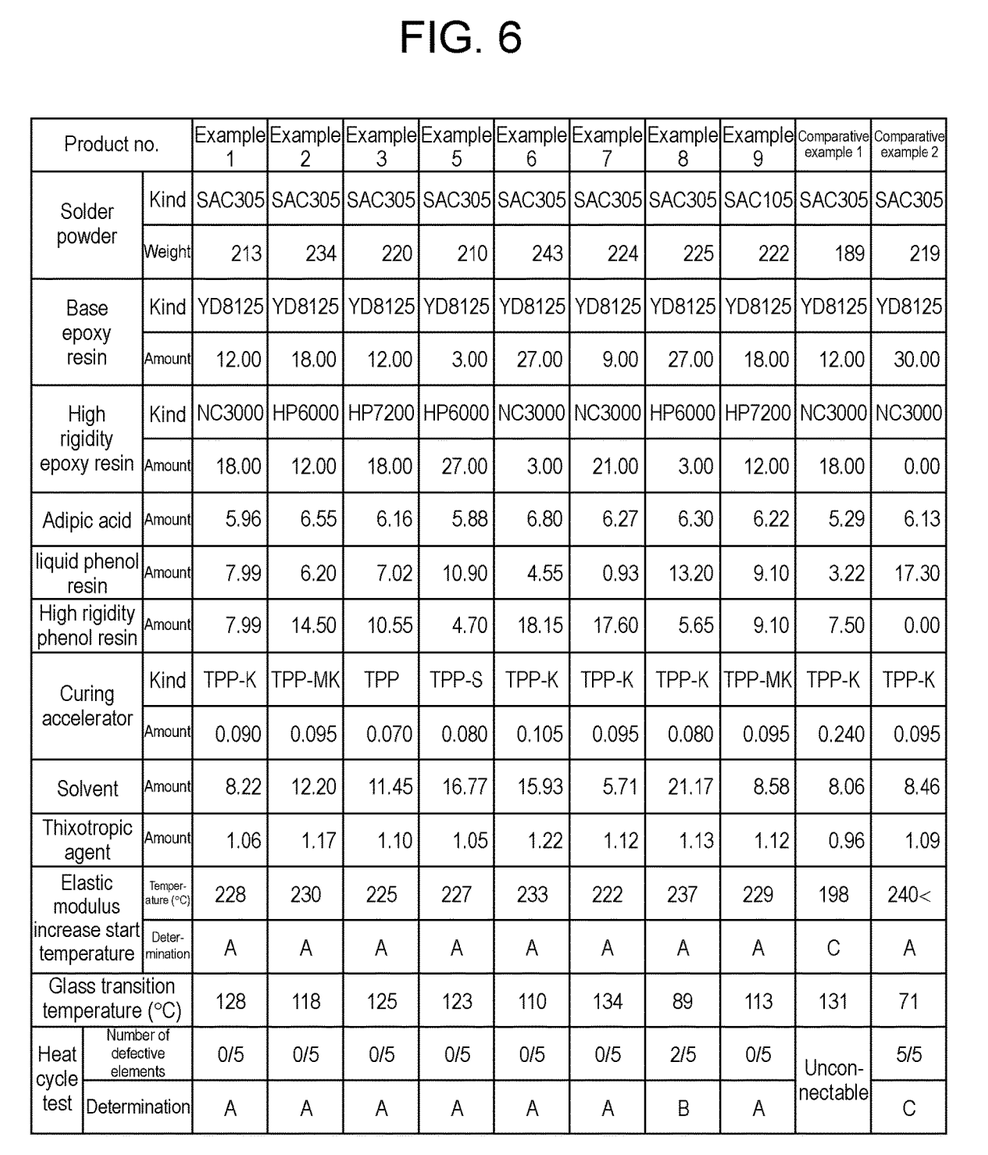
FIG. 6 is a table showing the characteristics of the resin flux solder paste.

Next, the epoxy resin, the phenol resin curing agent, the activator, the curing accelerator, the thixotropic agent, and the solvent were respectively weighed in the proportions (parts by weight) shown in FIG. 6 shown below. The mixture was heated and mixed to prepare a uniform resin mixture into a flux. Further, a SAC solder was added and kneaded using a planetary mixer to prepare resin flux solder pastes of Examples 1 to 9 and Comparative Examples 1 and 2.

Measurement Method

The following items were evaluated for Examples 1 to 9 and Comparative Examples 1 and 2. The evaluation results are collectively shown in FIG. 6 as the properties of the solder paste in each example. Measurement of Elastic Modulus Increase Start Temperature Using a viscoelasticity measuring device ("Rheometer DHR-2" manufactured by TA Instruments), the behavior of the elastic modulus change during heat curing and cooling of the flux was measured. The behavior of the elastic modulus change (storage elastic modulus (G) change) will be described with reference to FIGS. 4 and 5. A flux was prepared as a measurement sample with reference to the mixing amount shown in FIG. 6. The flux was heated and cooled according to a predetermined temperature profile, and the elastic modulus at each time (shown by the solid line in FIGS. 4 and 5) was measured in parallel. The temperature profile is shown by the dotted line in FIGS. 4 and 5, the temperature was raised from ordinary temperature (25° C.) at a constant rate of 20° C./min, kept at 230° C. for 8 minutes, and then cooled at a low rate of −20° C./min. When the flux was heated at a constant rate of 20° C./min, the "temperature at the start of the rapid increase" of the elastic modulus accompanying the curing reaction of the resin was read from the graph. Specifically, when the epoxy resin and the phenol novolac resin of the curing agent start a chemical reaction (curing reaction) due to the acceleration effect of the curing accelerator, since this reaction is a high temperature reaction, the reaction proceeds at once, the resin of the flux is made three-dimensional and the elastic modulus of the cured product is increased. The curved shape showing a change in elastic modulus suddenly changes from a substantially flat shape before the start of the reaction to an upward sloping shape with the start of the reaction. The temperature at which the temperature rapidly rises to the right was defined as the "temperature at the start of the rapid increase". The temperature thus obtained was defined as the viscoelasticity increase start temperature.

From the obtained elastic modulus increase start temperature, the resin flux solder paste was determined based on the following criteria.

A: The elastic modulus increase start temperature is 220° C. or higher.

C: The elastic modulus increase start temperature is lower than 220° C.

Measurement of Glass Transition Temperature Tg

The glass transition temperature Tg (unit: ° C.) of the resin flux paste was measured using a viscoelasticity measuring device (Rheometer "DHR-2" manufactured by TA Instruments). The measurement of the glass transition temperature will be described with reference to FIGS. 4 and 5. A flux was prepared as a measurement sample with reference to the mixing amount shown in FIG. 6. The flux was heated and cooled according to a predetermined temperature profile, and the loss tangents (tan δ: shown by the broken line in FIGS. 4 and 5) at each time were plotted in parallel to obtain a graph. The temperature profile used was similar to the temperature profile in the measurement of elastic modulus. The peak value was detected from the obtained loss tangent graph. The temperature at the peak value was defined as the glass transition temperature Tg of the cured product of the flux.

Heat Resistance Evaluation: Evaluation of Heat Cycle Reliability

Preparation of Heat Cycle Reliability Evaluation Element

The solder paste prepared as described above was printed on an Au-plated electrode on a circuit board (FR-4 board) using a metal mask to have a thickness of 0.1 mm and thus a solder paste print portion was formed.

Then, a CSP chip having a size of 10 mm×10 mm, a pitch of 0.4 mm, and 360 pins (0.4 mm BGA) was mounted on the solder paste print portion on the circuit board using a chip mounter. The electrode material of the circuit board was copper, and the board material was glass epoxy material. Then, a joint portion was formed by heating at 240° C. for 6 minutes using a reflow device, and a heat cycle reliability evaluation element was prepared.

Heat Cycle Reliability

For an evaluation of the solder connection reliability, heat cycle reliability was evaluated as follows. The cycle in which the five (measurement number n=5) heat cycle reliability evaluation elements prepared as described above were cooled to −40° C. and then heated to 125° C. was repeated for 1000 cycles. Then, the connection resistance value was measured. The heat cycle reliability was evaluated from the obtained connection resistance value based on the following evaluation criteria.

Evaluation Criteria

A: All of the connection resistance values of five evaluation elements are within a range of the standard resistance value of 2Ω±20%.

B: The connection resistance value of at least one of the five evaluation elements is within a range of the standard resistance value of 2Ω±20%.

C: All of the connection resistance values of the five evaluation elements are not included within a range of the standard resistance value of 2Ω±20%.

FIG. 5 shows the behaviors of the storage elastic modulus (G) and the loss tangent tan δ during heat curing and cooling of the resin flux of Example 2. Specifically, the storage elastic modulus (G) of the resin flux decreases with a decrease in viscosity as the temperature rises from room temperature at a constant rate, and becomes stable from around 80° C. Thereafter, the storage elastic modulus (G) at 230° C. increases with a rapid increase in viscosity. This indicates that the epoxy resin and the curing agent have started to react and crosslinked. Further, when the temperature in the furnace reaches a predetermined value at 240° C., the storage elastic modulus (G) is also stable. As shown in FIG. 5, when the reaction start temperature of the resin flux is 230° C., the reaction and thickening of the resin do not start at a melting point of 220° C. of the SAC solder, and thus, the solder can be melted and aggregated to form a metal joint.

Figure 4:
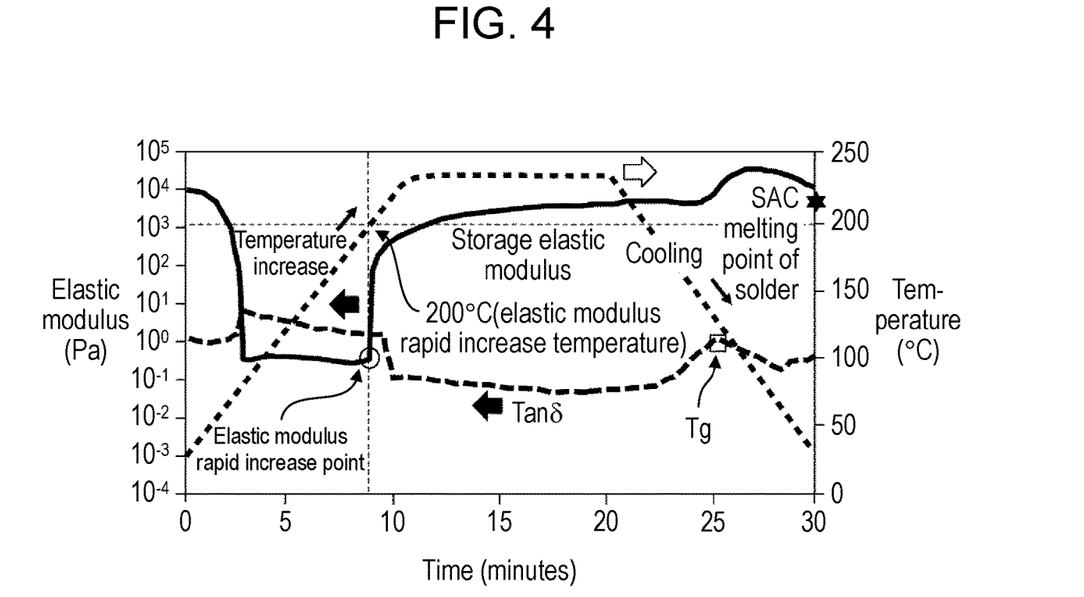
FIG. 4 shows the behavior of the elastic modulus when a flux of a resin flux solder paste of Comparative Example 1 is heated and cooled at a constant rate with a rheometer "DHR-2" viscoelasticity measuring device manufactured by TA Instruments Co., Ltd.

FIG. 4 shows the behaviors of the storage elastic modulus (G) and the loss tangent tan δ during heat curing and cooling of the resin flux of Comparative Example 1. In the resin flux of Comparative Example 1, the curing of the resin is started at 200° C. as compared with FIG. 5. Therefore, since the curing reaction has already progressed and the resin has thickened when the temperature inside the furnace reaches 220° C., which is the melting point of the SAC solder, the solder cannot be melted and aggregated, and remains as a solder ball.

As shown in FIG. 6, the resin flux pastes of Examples 1 to 9 contained a solder powder and a flux. The flux contained an epoxy resin, a curing agent, a curing accelerator, and an activator. The epoxy resin had an epoxy equivalent of 200 to 400 and contained 10% to 90% by weight of one or more of a biphenyl aralkyl type epoxy resin, a naphthalene type epoxy resin, and a dicyclopentadiene type epoxy resin with respect to the epoxy resin. The curing agent contained 30% to 95% by weight of a biphenyl aralkyl phenol resin having a hydroxyl group equivalent of 150 to 350 with respect to the total amount of the curing agent, and 5% to 70% by weight of a phenol novolac resin having an allyl group having a hydroxyl group equivalent of 100 to 200 with respect to the total amount of the curing agent.

As shown in FIG. 6, the heat resistance evaluation results of the resin flux pastes of Examples 1 to 5 were A or B.

As shown in FIG. 6, the resin flux paste of Comparative Example 1 contained 70.0% by weight of a phenol novolac resin H-4 with respect to the total amount of the curing agent, but H-4 did not have an allyl group. In addition, in the resin flux paste of Comparative Example 2, as the epoxy resin, one or more of a biphenyl aralkyl type epoxy resin, a naphthalene type epoxy resin, and a dicyclopentadiene type epoxy resin was not used. A phenol novolac resin having an allyl group was not contained. Further, the curing agent did not contain 30% to 95% by weight of a biphenyl aralkyl phenol resin and 5% to 70% by weight of a phenol novolac resin having an allyl group with respect to the total amount of the curing agent.

As shown in FIG. 6, since the resin flux paste of Comparative Example 1 could not be connected, the heat resistance could not be evaluated. The evaluation result of the resin flux paste of Comparative Example 2 was C.

It is clear that the resin flux pastes of Examples 1 to 9 are superior in heat resistance to the resin flux pastes of Comparative Examples 1 and 2.

Considering from the results of FIG. 6, it is considered that the Tg of the resin of the flux having an epoxy resin (high rigidity epoxy resin) and a phenol resin (high rigidity phenol resin) having a rigid skeleton can be increased, by using a resin with a large epoxy equivalent or a large hydroxyl group equivalent, and by using a curing accelerator of the type that accelerates the reaction at a high temperature, the curing of the resin does not proceed until the SAC solder is melted, and after the solder is melted, a curing reaction occurs rapidly in a short period of time to form a three-dimensional crosslinkage, so that excellent heat cycle reliability can be obtained.

The solder paste and mount structure according to the present disclosure can be used in a wide range of applications in the technical field of electrical and electronic circuit formation. For example, the present disclosure is applicable for connecting various electronic components and for joining such electronic components to a board. Further, the present disclosure is therefore also applicable to products in which such elements, components, and boards are installed, for example, such as DVD devices, cell phones, and general home electric appliances.

What is claimed is:

1. A resin flux solder paste comprising:
    a solder powder; and
    a flux,
    wherein the flux contains at least an epoxy resin, a curing agent, a curing accelerator, and an activator,
    the activator is a compound having a metal oxide film removing function,
    the epoxy resin contains 10% to 90% by weight of one or more of a biphenyl aralkyl type epoxy resin, a naphthalene type epoxy resin, and a dicyclopentadiene type epoxy resin, having an epoxy equivalent of 200 to 400, with respect to a total amount of the epoxy resin, and
    the curing agent contains 30% to 95% by weight of a biphenyl aralkyl phenol resin having a hydroxyl group equivalent of 150 to 350 with respect to a total amount of the curing agent, and 5% to 70% by weight of a phenol novolac resin having an allyl group having a hydroxyl group equivalent of 100 to 200 with respect to the total amount of the curing agent.
2. The resin flux solder paste of claim 1,
    wherein when the flux is heated at a constant rate of 20° C/min, a behavior in which an elastic modulus increases at 220° C. or higher is exhibited.
3. The resin flux solder paste of claim 1,
    wherein a glass transition temperature Tg of a cured product of the flux is 80° C. or higher.
4. The resin flux solder paste of claim 1,
    wherein the curing accelerator contains one or more of an organic phosphine compound and a salt thereof, and a quaternary phosphonium compound and a salt thereof.
5. The resin flux solder paste of claim 1,
    wherein the curing accelerator is one or more of triphenylphosphine, triphenylphosphine triphenylborane, tetraphenylphosphonium tetraphenylborate, and tetraphenylphosphonium-p-tolylborate.
6. The resin flux solder paste of claim 1,
    wherein the solder powder has a melting point of 200° C. or higher, and
    the solder powder contains simple Sn, a Sn-Ag-based alloy, a Sn-Cu-based alloy, a Sn-Ag-Cu-based alloy, or the alloy further containing an additional metal.
7. The resin flux solder paste of claim 1,
    wherein a content of the solder powder is 60% to 95% by weight with respect to 100% by weight of a total amount of the resin flux solder paste.
8. A mount structure in which an electronic component is mounted on a circuit board by using the resin flux solder paste of claim 1,
    the mount structure comprising:
    a conductive portion in which the electronic component and the circuit board are metallically joined; and
    a reinforcing portion formed by covering a periphery of the conductive portion with a cured product of the flux.
9. The resin flux solder paste of claim 1, wherein the activator is an organic acid or triethanolamine (TEA).

* * * * *